(12) United States Patent
Zimmer et al.

(10) Patent No.: US 9,064,707 B2
(45) Date of Patent: Jun. 23, 2015

(54) BONDING CONTACT AREA ON A SEMICONDUCTOR SUBSTRATE

(75) Inventors: Hans-Guenter Zimmer, Reute (DE); Pascal Stumpf, Horbourg-Wihr (FR)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 13/619,429

(22) Filed: Sep. 14, 2012

(65) Prior Publication Data

US 2013/0062779 A1    Mar. 14, 2013

Related U.S. Application Data

(60) Provisional application No. 61/534,671, filed on Sep. 14, 2011.

(51) Int. Cl.
| | |
|---|---|
| H01L 23/40 | (2006.01) |
| H01L 23/48 | (2006.01) |
| H01L 23/52 | (2006.01) |
| H01L 23/00 | (2006.01) |

(52) U.S. Cl.
CPC ....... *H01L 24/05* (2013.01); *H01L 2924/01029* (2013.01); *H01L 2224/05095* (2013.01); *H01L 2224/02125* (2013.01); *H01L 2224/02166* (2013.01); *H01L 2224/04042* (2013.01)

(58) Field of Classification Search
USPC ............................ 257/758, 774, 781; 438/612
See application file for complete search history.

(56) References Cited

U.S. PATENT DOCUMENTS

| | | | |
|---|---|---|---|
| 6,037,668 A * | 3/2000 | Cave et al. ................. | 257/784 |
| 6,522,021 B2 * | 2/2003 | Sakihama et al. .......... | 257/784 |
| 7,091,613 B1 * | 8/2006 | Long et al. ................. | 257/758 |
| 7,253,531 B1 * | 8/2007 | Huang et al. ............... | 257/784 |
| 7,397,125 B2 | 7/2008 | Oda | |
| 7,592,710 B2 * | 9/2009 | Hsia et al. .................. | 257/786 |
| 7,632,749 B1 | 12/2009 | Ogawa et al. | |
| 7,692,315 B2 * | 4/2010 | Watanabe et al. .......... | 257/781 |
| 7,741,716 B1 * | 6/2010 | Venkitachalam et al. .. | 257/758 |
| 7,883,917 B2 * | 2/2011 | Liu et al. ................... | 438/48 |
| 2001/0000928 A1 | 5/2001 | Lee et al. | |

(Continued)

FOREIGN PATENT DOCUMENTS

| | | |
|---|---|---|
| CN | 1519923 A | 8/2004 |
| DE | 10 2004 004 532 A1 | 9/2004 |

(Continued)

OTHER PUBLICATIONS

Chinese Search Report for Chinese Application No. 20110186013.5—English translation.

*Primary Examiner* — Shaun Campbell
*Assistant Examiner* — Ismail Muse
(74) *Attorney, Agent, or Firm* — Muncy, Geissler, Olds & Lowe, P.C.

(57) ABSTRACT

A bonding contact area on a semiconductor substrate is provided that includes a reinforcing structure having at least one conductive material layer arranged on the semiconductor substrate to receive the patterned reinforcing structure, a metal layer formed as a bonding contact layer with a bonding surface and arranged on a conductive material layer. Whereby, below the bonding surface, an oxide layer having at least about a 2 µm thickness is arranged, which extends beyond the edge of the bonding surface. The reinforcing structure is arranged in the oxide layer, when viewed looking down onto the bonding surface, outside the bonding surface within the oxide layer.

12 Claims, 2 Drawing Sheets

(56) References Cited

U.S. PATENT DOCUMENTS

| | | | |
|---|---|---|---|
| 2002/0006717 A1* | 1/2002 | Yamaha | 438/612 |
| 2003/0020163 A1* | 1/2003 | Hung et al. | 257/734 |
| 2003/0047794 A1* | 3/2003 | Watanabe | 257/503 |
| 2004/0182915 A1* | 9/2004 | Bachman et al. | 228/220 |
| 2005/0073058 A1 | 4/2005 | Kuo et al. | |
| 2005/0146041 A1* | 7/2005 | Watanabe et al. | 257/758 |
| 2005/0161835 A1 | 7/2005 | Maeda | |
| 2005/0167842 A1* | 8/2005 | Nakamura et al. | 257/758 |
| 2009/0212425 A1 | 8/2009 | Ito et al. | |
| 2010/0201000 A1* | 8/2010 | Antol et al. | 257/776 |

FOREIGN PATENT DOCUMENTS

| | | |
|---|---|---|
| EP | 0 875 934 A2 | 11/1998 |
| JP | 11-168101 A | 6/1999 |
| WO | WO 00/35013 | 6/2000 |

* cited by examiner

BONDING CONTACT AREA ON A SEMICONDUCTOR SUBSTRATE

This nonprovisional application claims priority to U.S. Provisional Application No. 61/534,671 which was filed on Sep. 14, 2011, and is herein incorporated by reference.

BACKGROUND OF THE INVENTION

1. Field of the Invention

The invention relates to a bonding contact area on a semiconductor substrate with a reinforcing structure.

2. Description of the Background Art

Bonding contact areas usually have a layer sequence of dielectrics, as well as contact and metallization levels. The top layer, called the bonding surface (bonding pad), is connected electrically by so-called bonding with a thin wire in the "package."

It is known that during a bonding process, mechanical loading and ultrasonic stresses applied by the bonding capillary tip to the bonding contact area can lead to a fracture up to breaking of the underlying dielectrics, deformation of the underlying metal structures, and delamination of the layers in the metal structures. These bonding failures may appear as craters in the bonding contact area and underlying layers and are usually not apparent during bonding but manifest themselves only during subsequent pull and shear tests or reliability tests.

These problems intensify as a result of new process options, such as 3-layer metallization, chip planarization (chemical-mechanical planarization), and replacement of gold bond wires by copper bond wires.

Thus, it is known to provide bonding contact areas with reinforcing structures uniformly or periodically in the lateral direction to improve their mechanical properties.

EP 0 875 934 B1, which corresponds to U.S. U.S. Pat. No. 6,143,396, describes a bonding contact area with at least one dielectric layer, which has a patterned reinforcing structure, which consists of interconnected metallization lines, arranged in a grid, for example.

SUMMARY OF THE INVENTION

It is therefore an object of the invention to provide a bonding contact area of the aforementioned type with improved properties, particularly with a higher reliability with respect to compatibility with copper bonding, which because of the higher energy absorption during bonding, as well as the higher operating temperature, requires robust and uniform bonding pad properties.

The bonding contact area according to an embodiment of the invention provides that on a semiconductor substrate with a reinforcing structure, with at least one first metal layer, arranged on the semiconductor substrate, for receiving the patterned reinforcing structure, with a third metal layer arranged as a bonding contact layer with a bonding surface (bonding pads) above the first metal layer, whereby an insulation layer, which extends beyond the edge of the bonding surface, is arranged below the bonding surface and above the first metal layer, the reinforcing structure when viewed looking down onto the bonding surface is formed below the bonding surface within the first metal layer, and the reinforcing structure comprises dielectric islands.

Such a bonding contact area in a semiconductor substrate with a reinforcing structure, which comprises at least one conductive material layer, arranged on the semiconductor substrate, for receiving the patterned reinforcing structure and a metal layer formed as a bonding contact layer with a bonding surface (bonding pads) and arranged on a conductive metal layer, according to an embodiment includes, that the reinforcing structure is formed of regularly arranged islands of a first and second form, the islands of the first form are arranged in grid form, in each case an island of the second form is arranged between four neighboring islands, forming grid points, of the first form, and the islands of the second form form a grid-like structure.

Good mechanical properties of the bonding contact area are attained with this structured, conductive material layer of the invention, preferably metal, such as aluminum or copper, so that during bonding the forces are absorbed better in order to suppress or at least to minimize thereby crack formation to the substrate.

With the frame-like enclosure of the centrally arranged reinforcing structure according to an advantageous refinement of the invention, an electrical contact with the bonding contact layer can be produced preferably in the area of this frame-like enclosure by means of through-connections (vias) arranged in at least one dielectric layer. Thereby, such through-connections, which have an unfavorable effect mechanically but are necessary for the electrical connection of the conductive material layers, are realized outside the bonding pad area stressed mechanically by the bonding. The dielectric layer receiving the vias is also free of such through-connections in the area under the bonding pad. Such bonding contact areas are suitable especially for applications in motor vehicles, because no active electronic components in the underlying semiconductor substrate are realized in the area of the reinforcing structure.

Another embodiment includes that the reinforcing structure has a pattern of regularly arranged islands, the conductive material layer surrounds the reinforcing structure like a frame, and the conductive material layer in the edge region is connected electrically to the bonding contact layer by means of through-connections, arranged in at least one dielectric layer.

Thereby, the necessary through-connections, which have an unfavorable effect mechanically but are necessary for the electrical connection of the conductive material layers, are realized outside the bonding pad area stressed mechanically by the bonding. The dielectric layer receiving the vias is also free of such through-connections in the area under the bonding pad. These bonding contact areas of the invention are suitable especially for applications in motor vehicles, because no active electronic components in the underlying semiconductor substrate are realized in the area of the reinforcing structure.

According to an embodiment, in this second solution, the islands are formed in a first and second form, whereby the islands of the first form are arranged in grid form, and in each case an island of the second form is arranged between four neighboring islands, forming grid points, of the first form, and the islands of the second form also form a grid-like structure.

In an embodiment, the islands of the first form in the level of the conductive material layer have a square or rectangular cross section, so that such islands can be easily produced, because the structure arising thereby is four-fold rotationally symmetric.

In another embodiment of the invention, the islands of the second form in the level of the conductive material layer have a cross-shaped cross section and thereby also form a grid-like, four-fold rotationally symmetric structure, so that the pattern arising thereby of the reinforcing structure is again four-fold rotationally symmetric. Preferably, in this case, it has proven especially advantageous if in the level of the conductive material layer the boundaries of neighboring islands of the second form and the boundaries between islands of the first form and second form have an identical distance. Thereby, in the area of the pattern of the reinforcing structure, which is preferably produced from the dielectric, thus in the central area of the material layer receiving this reinforcing structure, the amount of dielectric predominates compared with the material amount of the conductive material layer.

In an embodiment, another conductive material layer is provided, which is arranged on the conductive material layer having the reinforcing structure and has a centrally arranged island of dielectric, which is surrounded frame-like by the conductive material layer. Thereby, in this refinement of the invention as well, the area under the bonding pad remains free of other structures. The bonding contact area arising in such a way has, under the bonding pad, areas of dielectric, which are perpendicular to the substrate surface and are not interrupted in the layer sequence. This results in a strength of the bonding contact area up to the elastic deformation limit of the material.

Other dielectric layers between the two conductive material layers or between the bonding pad and the underlying conductive material layer can have the through-connections, necessary for the electrical connection, in a similar way only in the edge region.

According to an embodiment of the invention, between the two conductive material layers a dielectric layer can be arranged, which connects the two conductive material layers electrically by through-connections arranged in the edge region.

To keep the actual bonding pad free from structures reducing the load-carrying capacity, the bonding pad defined by an opening in a passivation layer is free of through-connections. According to an embodiment of the invention, these through-connections are arranged in an edge region of the passivation layer.

Furthermore, it is especially advantageous if the conductive material layer, which has the reinforcing structure, is arranged on the substrate side in regard to other material and/or dielectric layers, i.e., that this conductive material layer lies as close as possible to the substrate. Possibly arising cracks are therefore intercepted by this structured material layer. The conductive material layers are made of metal, preferably of aluminum and/or copper, and the through-connections in the dielectric layers are filled for the electrical contacting with metal, preferably with tungsten or aluminum.

According to an embodiment, the edge of the bonding contact layer can be offset relative to the outer edge and also relative to the inner edge of the metallic frame of the second metal layer. Moreover, the outer edge and also the inner edge of the frame of the second metal layer is also offset relative to the outer edge and the inner edge of the frame of the first metal layer. The outer edge and the inner edge of the frame of the first metal layer are also offset relative to the edge, so that none of the edges in the first metal layer and in the second metal layer and in the bonding contact layer lie one above another. In other words, the particular outer edges of the metallic frames in the individual metal levels and of the bonding surfaces are each offset laterally to one another.

Tests by the applicant have shown that crack formation can be effectively reduced by means of the metal layer edges offset to one another. It should be noted that the individual frames and the bonding contact layer are connected only in an alternative embodiment by means of vias or through-connections and electrically.

It is understood that the present principle of edges, offset to one another, of the individual frames can be expanded to more than 3 metal levels.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
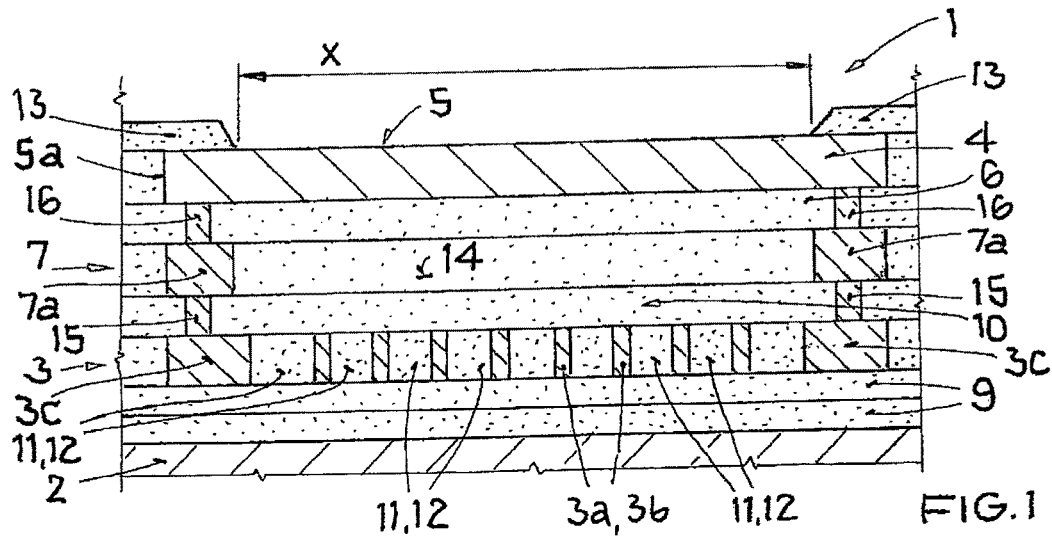
FIG. 1 is a cross-sectional illustration of a first exemplary embodiment of the bonding contact area of the invention.

Bonding contact area 1 according to FIG. 1 is arranged on a semiconductor substrate 2, in which outside an area marked with an x active semiconductor elements can be realized, such as, for example, transistors, diodes, memory, or sensor elements and the like.

This bonding contact area 1 consists of a number of, preferably three, material layers one above another; of a first metal layer 3 of aluminum, which is arranged on substrate 2, but separated from substrate 2 by two thin dielectric layers 9, and has a reinforcing structure 10 of a dielectric, which is spaced apart from a second metal layer 7 by a first dielectric layer 8; and finally of a third metal layer representing a bonding contact layer 4, likewise of aluminum. The surface of bonding contact layer 4 forms a bonding surface or a bonding pad 5, whereby this surface is surrounded in a rectangular manner by a passivation layer 13, as is indicated in a plan view in FIG. 2. Bonding contact layer 4 has an edge 5a, which is formed under passivation layer 13; i.e., passivation layer 13 overlaps bonding contact layer 4 on all sides at the edge. A second dielectric layer 6 is arranged between second metal layer 7 and bonding contact layer 4. The material of both the first and second dielectric layer 8 and 6 usually consists of silicon dioxide $SiO_2$.

It is clearly evident from FIG. 1 that outside bonding contact layer 4 or bonding contact area 5 a reinforcing structure is arranged within insulation layer 14, which is to be at least 2 μm thick. Insulation layer 14 in this case can be made this thick as a single layer or can consist of a number of partial insulation layers lying one above another, as indicated in FIG. 1.

Figure 2:
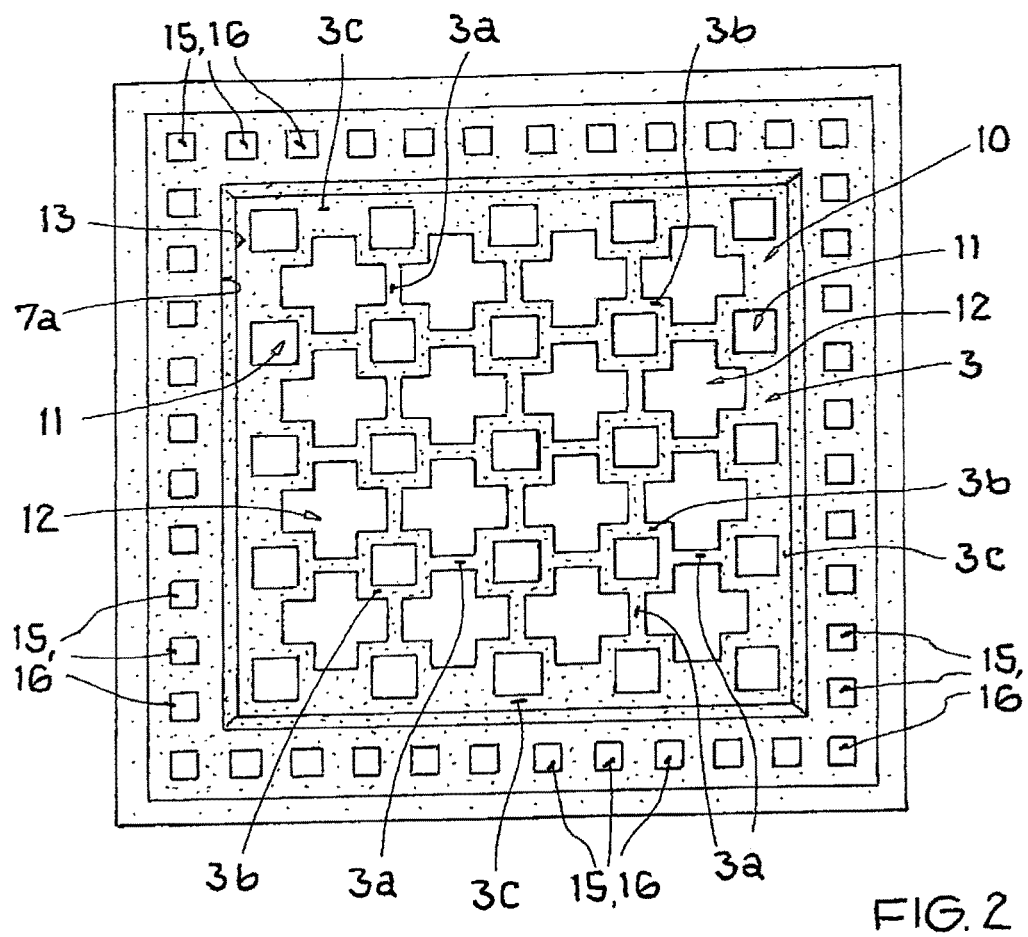
FIG. 2 is a cross-sectional illustration in a plan view of a reinforcing structure of the invention of the bonding contact area according to FIG. 1.

The pattern of reinforcing structure 10, which is realized in first metal layer 3, is made up of individual pattern elements, which are formed as islands 11 and 12 with different forms and each consists of a dielectric, such as, for example, silicon dioxide. In the plan view of this first metal layer 3 according to FIG. 2, islands 11 consist of a first form with a square cross section in the level of metal layer 3 and islands 12 in cross section consist of a second, cross-shaped form.

Both the square islands 11 and cross-shaped islands 12 are each arranged in the shape of a grid, whereby a cross-shaped island 12 lies between four neighboring islands 11, whereby these four neighboring islands 11 form grid points of the grid-shaped structure spanned by islands 11.

The boundaries of neighboring cross-shaped islands 12 and the boundaries between cross-shaped islands 11 and square islands 12 have the same, constant distance, so that as a result crosspiece-like material of metal layer 3 remains between islands 11 and 12. Thus, the metal crosspieces between cross-shaped islands 12 are designated by 3a and the metal crosspieces between grid-shaped islands 11 and cross-shaped islands 12 by 3b.

Reinforcing structure 10 is surrounded by a closed edge 3c of metal layer 3, whereby metal layer 3 in the area of this edge 3c is connected electrically to second metal layer 7 by means of through-connections 15 arranged in first dielectric layer 8.

This second metal layer 7 is structured like a frame, so that a metallic frame 7a encloses a dielectric island 14. An oxide island 14 can also be provided instead of a dielectric island 14. This metallic frame 7a is electrically connected by through-connections 15 in first dielectric layer 8 of metallic frames 3c of first metal layer 3.

Further, this frame 7a of second metal layer 7 is connected to third metal layer 4 by through-connections 16 arranged in a second dielectric layer 6. Through-connections 16 also lie in the edge region of second dielectric layer 6, particularly congruent to through-connections 15 of first dielectric layer 8. Through-connections 15 or 16 consist of tungsten or aluminum.

As is evident from FIG. 2, these through-connections 15 and 16 are arranged on all four sides of bonding contact area 1, therefore frame these completely, and thus are not part of the actual bonding pad structure but lie vertically under passivation layer 13. This is also evident from the plan view according to FIG. 2, according to which reinforcing structure 10 lies within the frame formed by passivation layer 13. The framing adjacent thereto is formed by the inner edge of frame 7a of second metal layer 7

In the area of reinforcing structure 10, i.e., under bonding surface 5 defined by passivation layer 13, there are vertical columns of dielectric of all layers, beginning with islands 11 or 12 of the first metal layer up to second dielectric layer 6, as a result of which a high mechanical resistance is achieved.

Figure 3:
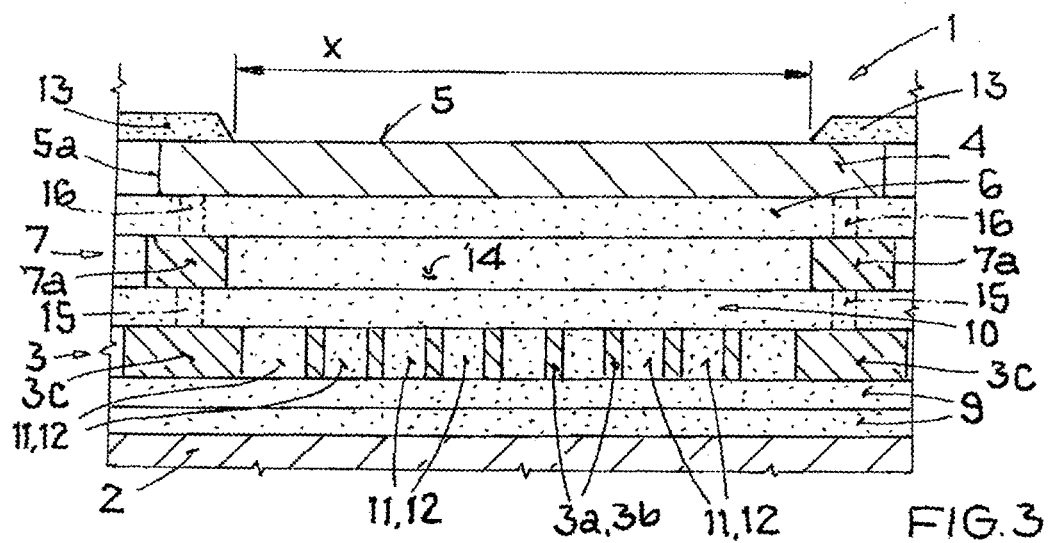
FIG. 3 is a cross-sectional illustration of a second exemplary embodiment of the bonding contact area of the invention.

A second advantageous embodiment of a bonding contact area 1 is shown in FIG. 3. Only the differences relative to the embodiment shown in the illustration of FIG. 1 will be described below. Bonding contact layer 4 is bounded by edge 5a. In this regard, edge 5a of bonding contact layer 4 is offset relative to the outer edge and also relative to the inner edge of metallic frame 7a of second metal layer 7. Further, the outer edge and also the inner edge of frame 7a of the second metal layer are also offset relative to the outer edge and the inner edge of frame 3c of first metal layer 3. The outer edge and the inner edge of frame 3c of first metal layer 3 are also offset relative to edge 5a, so that none of the edges in first metal layer 3 and in second metal layer 7 and in bonding contact layer 4 lie one above another. In other words, the particular outer edges of metallic frames 3c, 7a and of bonding surface 5a are each offset laterally to one another. It should be noted that the individual frames 3c and 7a and bonding contact layer 4 are connected electrically only in an alternative embodiment by means of vias or through-connections 15 and 16.

It is understood that the present principle of edges, offset to one another, of the individual frames can be expanded to more than 3 metal levels.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A bonding contact area on a semiconductor substrate with a reinforcing structure, comprising:
    at least one first metal layer arranged on the semiconductor substrate and adapted to receive a patterned reinforcing structure, the first metal layer including a first metallic frame formed to surround the patterned reinforcing structure;
    a third metal layer arranged as a bonding contact layer with a bonding surface above the first metal layer;
    a second metal layer arranged between the first metal layer and the third metal layer, the second metal layer being structured as a second metallic frame surrounding a centrally arranged island of dielectric;
    an insulation layer that extends beyond an edge of the bonding surface, the insulation layer being arranged below the bonding surface and above the first metal layer;
    a first dielectric layer arranged between, and contacting, the first metal layer and the second metal layer, the first dielectric layer including first through-connections that is arranged in an edge area of the first metal layer and an edge area of the second metal layer and that is electrically connecting the first metal layer and the second metal layer; and
    a second dielectric layer arranged between, and directly contacting, the second metal layer and the third metal layer, the second dielectric layer including second through-connections that is arranged in the edge area of the second metal layer and an edge area of the third metal layer and that is electrically connecting the second metal layer and the third metal layer;
    wherein the patterned reinforcing structure, when viewed looking down onto the bonding surface, is formed below the bonding surface within the first metal layer,
    wherein the patterned reinforcing structure comprises dielectric islands,
    wherein there is a dielectric area extending from under the bonding surface to the semiconductor substrate,
    wherein outer edges of the first metallic frame, the second metallic frame and the bonding surface are each offset laterally to one another,
    wherein only a single centrally arranged island of dielectric is provided in a region of the second metal layer surrounded by the second metallic frame, and
    wherein the first metallic frame is laterally wider than the second metallic frame.

2. The bonding contact area according to claim 1, wherein the insulation layer has a thickness of at least about 2 μm and includes a plurality of sublayers.

3. The bonding contact area according to claim 1, wherein the reinforcing structure is formed of regularly arranged islands of first and second forms, wherein the islands of the first form are arranged in a grid form, wherein, between four directly neighboring islands, a second form is arranged in each case, and wherein the islands of the second form create a grid-like structure.

4. The bonding contact area according to claim 1, wherein the islands of the first form in the level of the first metal layer have a square or rectangular cross section.

5. The bonding contact area according to claim 1, wherein the islands of the second form in the level of the first metal layer have a cross-shaped cross section.

6. The bonding contact area according to claim 1, wherein the bonding surface is defined by an opening of a passivation layer and the through-connections are arranged in an edge region of the passivation layer.

7. The bonding contact area according to claim 1, wherein inner edges of the first metallic frame and the second metallic frame are offset laterally to each other.

8. The bonding contact area according to claim 1, wherein the outer edge of the first metallic frame is positioned outside of the outer edge of the second metallic frame, and the outer edge of the second metallic frame is positioned outside of the outer edge of the bonding surface.

9. The bonding contact area according to claim 1, wherein the first dielectric layer directly contacts the first metal layer and the second metal layer.

10. The bonding contact area according to claim 1, wherein the first through-connections directly contact the edge area of the first metal layer and the edge area of the second metal layer.

11. The bonding contact area according to claim 1, wherein the second through-connections directly contact the edge area of the second metal layer and the edge area of the third metal layer.

12. The bonding contact area according to claim 1, wherein the second metal layer includes no metallic crosspieces in a region surrounded by the second metallic frame.

* * * * *